US009664497B2

(12) United States Patent
Kerdraon et al.

(10) Patent No.: US 9,664,497 B2
(45) Date of Patent: May 30, 2017

(54) MAGNETIC FIELD SENSOR AND METHOD FOR SENSING RELATIVE LOCATION OF THE MAGNETIC FIELD SENSOR AND A TARGET OBJECT ALONG A MOVEMENT LINE

(71) Applicant: Allegro Microsystems, LLC, Worcester, MA (US)

(72) Inventors: Thomas Kerdraon, Lenzkirch (DE); Andreas P. Friedrich, Metz-Tessy (FR); Yannick Vuillermet, La Motte Servolex (FR)

(73) Assignee: Allegro MicroSystems, LLC, Worcester, MA (US)

( * ) Notice: Subject to any disclaimer, the term of this patent is extended or adjusted under 35 U.S.C. 154(b) by 2 days.

(21) Appl. No.: 14/570,357

(22) Filed: Dec. 15, 2014

(65) Prior Publication Data

US 2015/0176962 A1  Jun. 25, 2015

Related U.S. Application Data

(60) Provisional application No. 61/920,044, filed on Dec. 23, 2013.

(51) Int. Cl.
| G01R 33/07 | (2006.01) |
| G01R 33/06 | (2006.01) |
| G01R 33/09 | (2006.01) |
| G01B 7/30 | (2006.01) |
| G01B 7/14 | (2006.01) |

(Continued)

(52) U.S. Cl.
CPC ............... *G01B 7/14* (2013.01); *G01D 5/145* (2013.01); *G01R 33/0005* (2013.01); *G01R 33/06* (2013.01); *G01R 33/072* (2013.01)

(58) Field of Classification Search
CPC ...... G01R 33/07; G01R 33/075; G01R 33/06; G01R 33/09; G01R 35/00; G01B 7/30; G01B 7/146; G01D 5/147
USPC .... 324/202, 207.2, 207.11–207.26, 244–262
See application file for complete search history.

(56) References Cited

U.S. PATENT DOCUMENTS 5,841,621 A * 11/1998 Dean .................... G01D 5/2013
361/185
6,181,036 B1 * 1/2001 Kazama ................ G01D 5/145
310/67 R (Continued)

FOREIGN PATENT DOCUMENTS

DE    10 2006 037 226 A1    2/2008

OTHER PUBLICATIONS

U.S. Appl. No. 15/074,358, filed Mar. 18, 2016, Kranz et al.
(Continued)

*Primary Examiner* — Arleen M Vazquez
*Assistant Examiner* — Neel Shah
(74) *Attorney, Agent, or Firm* — Daly, Crowley, Mofford & Durkee, LLP

(57) ABSTRACT

A magnetic field sensor with a magnet is disposed proximate to a ferromagnetic target object having at least one ferromagnetic surface. The magnetic field sensor is operable to sense a relative location between the magnetic field sensor and the ferromagnetic target object along a movement line. In some embodiments, the target object is also spinning about a rotation axis parallel to the movement line. A corresponding method is described.

58 Claims, 12 Drawing Sheets

(51) Int. Cl.
*G01D 5/14* (2006.01)
*G01R 33/00* (2006.01)

(56) References Cited

U.S. PATENT DOCUMENTS

| | | | | |
|---|---|---|---|---|
| 2009/0001965 | A1* | 1/2009 | Ausserlechner | G01D 5/145 324/202 |
| 2009/0146647 | A1* | 6/2009 | Ausserlechner | G01D 5/145 324/207.21 |
| 2011/0227568 | A1* | 9/2011 | Dordet | G01D 5/145 324/251 |
| 2012/0158335 | A1* | 6/2012 | Donovan | G05B 19/0423 702/79 |
| 2012/0262155 | A1 | 10/2012 | Donovan et al. | |
| 2015/0022188 | A1 | 1/2015 | Daubert et al. | |

OTHER PUBLICATIONS

U.S. Appl. No. 15/042,469, filed Feb. 12, 2016, Tima, et al.
PCT Search Report and Written Opinion of the ISA dated Mar. 25, 2015; for PCT Pat. App. No. PCT/US2014/070339; 16 pages.
PCT International Preliminary Report on Patentability and Written Opinion dated Jul. 7, 2016; for PCT Pat. App. No. PCT/US2014/070339; 14 pages.
Letter from A.A. Thornton letter dated Feb. 13, 2017 regarding amended claims for EP Pat. Appl. No. 14827615.7; 4 pages.
Amended Claims pp. 36 to 45 regarding A.A. Thornton letter dated Feb. 13, 2017 for EP Pat. Appl. No. 14827615.7; 10 pages.

* cited by examiner

MAGNETIC FIELD SENSOR AND METHOD FOR SENSING RELATIVE LOCATION OF THE MAGNETIC FIELD SENSOR AND A TARGET OBJECT ALONG A MOVEMENT LINE

CROSS REFERENCE TO RELATED APPLICATIONS

This application claims the benefit under 35 U.S.C. §119 (e) of U.S. Provisional Application No. 61/920,044 filed Dec. 23, 2013, which application is incorporated herein by reference in its entirety.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can sense a relative location of the magnetic field sensor and a target object along a movement line.

BACKGROUND OF THE INVENTION

Various types of magnetic field sensing elements axe known, including Hall Effect elements and magnetoresistance elements. Magnetic field sensors generally include a magnetic field sensing element and other electronic components. Some magnetic field sensors also include a fixed permanent magnet in a so-called "back biased" arrangement.

Magnetic field sensors provide an electrical signal representative of a sensed magnetic field. In some embodiments, the magnetic field sensor provides information about a sensed ferromagnetic object by sensing fluctuations of the magnetic field associated with the magnet part of the magnetic field sensor as an object moves within a magnetic field generated by the magnet. In the presence of a moving ferromagnetic object, the magnetic field signal sensed by the magnetic field sensor varies in accordance with a shape or profile of the moving ferromagnetic object.

In other embodiments, the magnetic field sensor has no magnet, and the magnetic field sensor provides information about a sensed object to which a magnet is coupled.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus, it is the rotation of the target object (e.g., camshaft) that is sensed by detection of the moving features of the gear. Gear tooth sensors are used, for example, in automotive applications to provide information to an engine control processor for ignition timing control, fuel management, and other operations.

In other embodiments, a ring magnet with a plurality of alternating poles, which can be ferromagnetic or otherwise magnetic, is coupled to the target object. In these embodiments, the magnetic field sensor senses rotation of the ring magnet and the target object to which it is coupled.

Information provided by the gear tooth sensor to the engine control processor can include, but is not limited to, an absolute angle of rotation of a target object (e.g., a camshaft) as it rotates, a speed of rotation, and, in some embodiments, a direction of rotation. With this information, the engine control processor can adjust the timing of firing of the ignition system and the timing of fuel injection by the fuel injection system.

A gear tooth sensor can use two or more magnetic field sensing elements coupled to a differential amplifier in a differential arrangement. Advantages of differential arrangements are known, and include, but are not limited to, improved performance in the presence of electrical or magnetic noise.

Conventional magnetic field sensors, e.g., gear tooth sensors, do not provide an output signal representative of a relative location of the magnetic field sensor and the gear or shaft in an axial direction along an axis of the shaft. In some applications, it would be desirable to provide a magnetic field sensor that can generate an output signal representative of a relative location of the magnetic field sensor and a target object in a linear direction. It would be further desirable to provide a magnetic field sensor that can generate the above output signal both if the target object is spinning and also if the target object is not spinning about the axis.

SUMMARY OF THE INVENTION

The present invention provides a magnetic field sensor and method that can generate an output signal representative of a relative location of the magnetic field sensor and a target object in an axial direction along a movement line. The present invention also provides a magnetic field sensor that can generate the above output signal both if the target object is spinning and also if the target object is not spinning about the axis.

In accordance with an example useful for understanding an aspect of the present invention, a magnetic field sensor includes a magnet operable to generate a DC magnetic field. The magnetic field sensor also includes first and second magnetic field sensing elements operable to sense first and second influenced magnetic fields, respectively, related to the DC magnetic field but influenced by at least one ferromagnetic surface upon a ferromagnetic target object. The first and second magnetic field sensing elements are disposed proximate to the at least one ferromagnetic surface. The first and second magnetic field sensing elements are also operable to generate corresponding first and second electronic signals related to the first and second influenced magnetic fields, respectively, wherein a difference of amplitudes of the first and second electronic signals is related to a relative location of the magnetic field sensor and the ferromagnetic target object along a movement line.

In accordance with another example useful for understanding an aspect of the present invention, a method of sensing a relative location of a magnetic field sensor and a ferromagnetic target object along a movement line includes generating a DC magnetic field. The method also includes placing a first and second magnetic field sensing elements proximate to at least one ferromagnetic surface of the ferromagnetic target object. The method also includes sensing, with the first and second magnetic field sensing elements, first and second influenced magnetic fields, respectively, related to the DC magnetic field but influenced by the at least one ferromagnetic surface. The method also includes generating, with the first and second magnetic field sensing elements, corresponding first and second electronic signals related to the first and second influenced magnetic fields, respectively, wherein a difference of amplitudes of the first and second electronic signals is related to the relative location of the magnetic field sensor and the ferromagnetic target object along the movement line.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
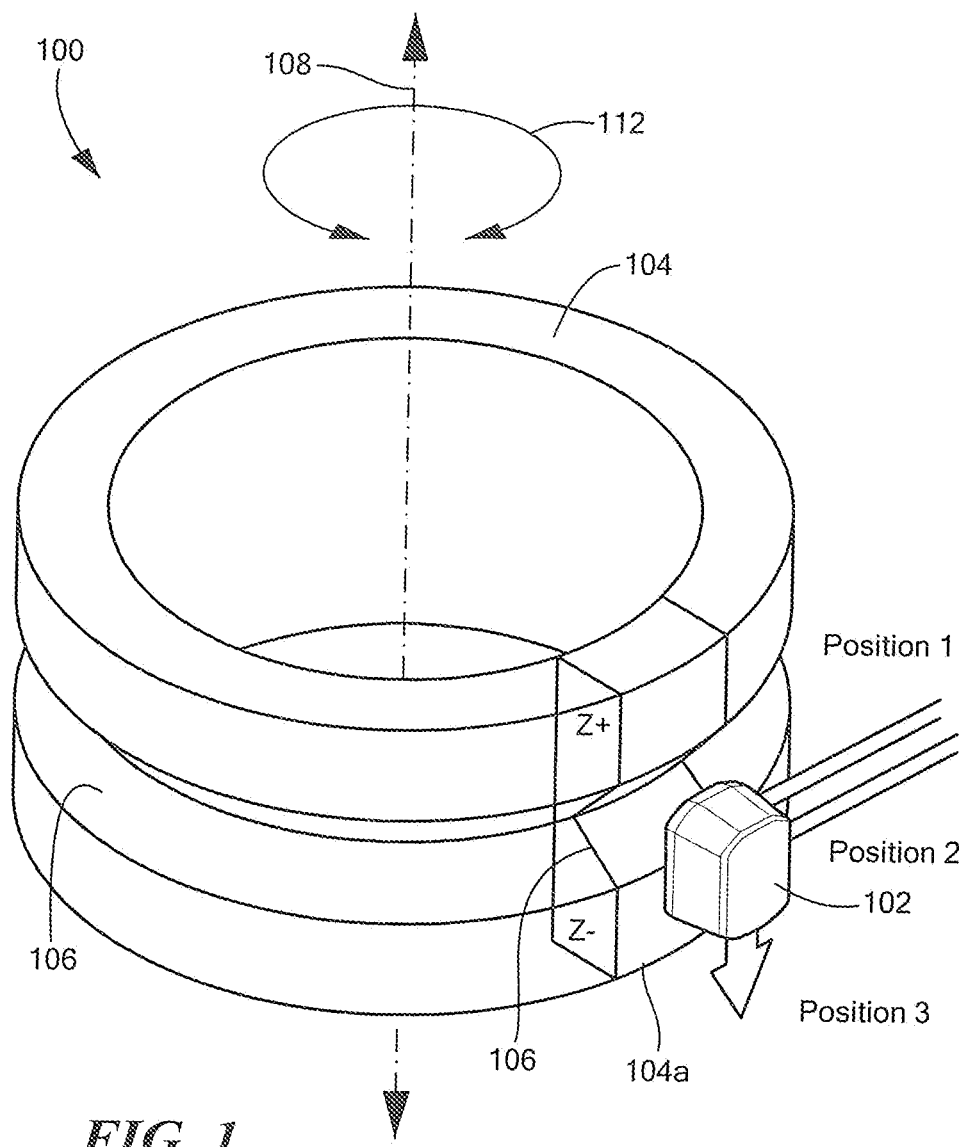
FIG. 1 is a perspective pictorial diagram showing a target object having a circumferential groove, and a magnetic field sensor proximate to the groove.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an isotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a curl-era-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions.

As used herein, the term "groove" is used to describe a furrow or channel, for example, in a target object. The groove forms an indent in an outer surface of the target object. The groove can circumscribe the target object, extending all the way around the target object. In other embodiments, the groove can extend only around or extend upon a portion of the outer surface of the target object, in which cases, the groove does not extend all the way around the target object. The groove can be V-shaped with flat first and second surfaces that intersect at a sharp vertex. However, in other embodiments, the surfaces of the groove are not flat and/or the vertex is not sharp, but is instead rounded or flat.

As used herein, the term "ridge" is used to describe a raised region, for example, in a target object. The ridge extends above an outer surface of the target object. The ridge can circumscribe the target object, extending all the way around the target object. In other embodiments, the ridge can extend only around or extend upon a portion of the outer surface of the target object, in which cases, the ridge does not extend all the way around the target object. The ridge can be V-shaped with flat first and second surfaces intersecting at a sham vertex. However, in other embodiments, the surfaces of the ridge are not flat and/or the vertex is not sharp, but is instead rounded or flat.

As used herein below, the term "target object" is used to describe a mechanical structure, movement of which is sensed by a magnetic field sensor.

As used herein, the term "movement axis" is used to describe an axis along which a target object can move linearly relative to a location of a magnetic field sensor. The term "movement axis" is also used to describe an axis along which the magnetic field sensor can move linearly relative of a location of a ferromagnetic target object. In some arrangements, both the ferromagnetic target object and the magnetic field sensor can move relative to each other along respective movement axes.

As used herein, the term "movement line" is used to describe a line, which may be straight or curved, along which a target object can move relative to a location of a magnetic field sensor. The term "movement line" is also used to describe a line, straight or curved, along which the magnetic field sensor can move relative of a location of a ferromagnetic target object. In some arrangements, both the ferromagnetic target object and the magnetic field sensor can move relative to each other along respective movement lines.

It should be understood that a movement line can be a movement axis and a movement axis can be a movement line. However, a movement line can be curved while a movement axis is straight.

As used herein, the term "rotation axis" is used to describe an axis upon which a target object can rotate or spin.

In some arrangements, the movement axis and the rotation axis are parallel to each other. In some arrangements, the movement axis and the rotation axis are the same axis.

Referring now to FIG. 1, a sensing arrangement 100 can include a magnetic field sensor 102 disposed proximate to a ferromagnetic target object 104. The magnetic field sensor 102 can include a back biasing magnet (not shown), and two magnetic field sensing elements (not shown) disposed between the ferromagnetic target object 104 and the back biasing magnet.

The ferromagnetic target object 104 can include a circumferential groove 106. A portion 104a of the ferromagnetic target object 104 is shown and is representative of a cross section of the ferromagnetic target object 104 to more clearly show the groove 106.

As will become apparent from discussion below, an output signal from the magnetic field sensor 102 is representative of a relative location of the ferromagnetic target object 104 relative to the magnetic field sensor 102 in a direction along an axis 108, i.e., the axis 108 can be a movement axis as defined above. In some arrangements, the magnetic field sensor 102 can move parallel to the axis 108. In other embodiments, the ferromagnetic target object 104 can move parallel to the axis 108. In still other embodiments, both the magnetic field sensor 102 and the ferromagnetic target object can move parallel to the axis 108.

In some embodiments, the ferromagnetic target object 104 is also operable to rotate or spin about the axis 108, i.e., the axis 108 can also be a rotation axis as defined above. It will become apparent from discussion below that the spin of the ferromagnetic target object, in some embodiments, has no effect upon the output signal generated by the magnetic field sensor, and the magnetic field sensor is responsive only to relative location of the ferromagnetic target object 104 and the magnetic field sensor 102 in a direction parallel to the axis 108.

Figure 2:
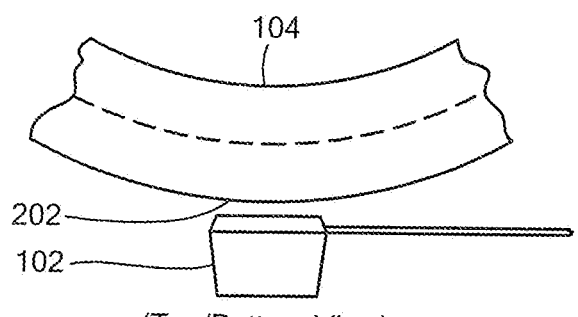
FIG. 2 is a side view pictorial diagram showing the target object and the magnetic field sensor of FIG. 1.

Referring now to FIG. 2, in which like elements of FIG. 1 are shown having like reference designations, the ferromagnetic target object 104 and the magnetic field sensor 102 are separated by an air gap 202. It will be understood that a dimension of the air gap 202 is related to a magnitude of magnetic fields sensed by the magnetic field sensor 102.

Figure 3:
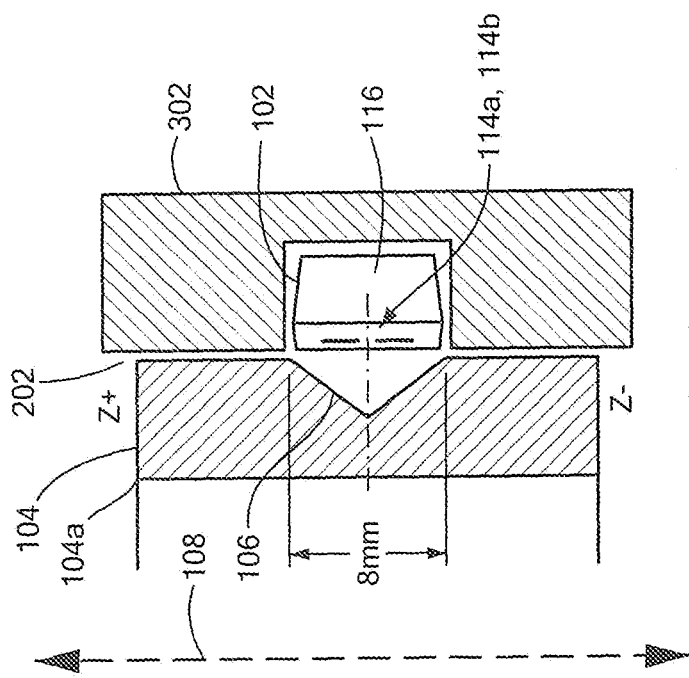
FIG. 3 is a cross-sectional view of the target object and magnetic field sensor of FIG. 1.

Referring now to FIG. 3, in which like elements of FIGS. 1 and 2 are shown having like reference designations, the ferromagnetic target object 104, i.e., the portion 104a of the ferromagnetic target object 104 is proximate to the magnetic field sensor 102. The ferromagnetic target object 104 is capable of movement in a direction of the axis 108. In some arrangements, the ferromagnetic target object 104 is also capable of rotation 112 about the axis 108. The ferromagnetic target object 104 has the groove 106.

The magnetic field sensor 102 can include a permanent magnet 116. The magnetic field sensor 102 can also include two magnetic field sensing elements 114a, 114b disposed between the ferromagnetic target object 104 in the magnet 116, resulting in a back-biased arrangement. The two magnetic field sensing elements 114a, 114b can be arranged as shown, such that a line between the two magnetic field sensing elements is parallel to the axis 108 and perpendicular to a vertex (e.g., corner) of the groove 106. However, in other embodiments, the line between the two magnetic field sensing elements 114a, 114b can be at another angle so long as the line is not perpendicular to the axis 108. For example, the line between the two magnetic field sensing elements 114a, 114b can be within about +/−seventy-five degrees of parallel to the axis 108. However, angles within about +/−twenty degrees are preferred. Alignment in three dimensions is described more fully below in conjunction with FIG. 6.

In some embodiments, the two magnetic field sensing elements 114a, 114b are Hall effect elements. In other embodiments, the two magnetic field sensing elements 114a, 114b are magnetoresistance elements. Other types of magnetic field sensing elements are also possible.

The two magnetic field sensing elements 114a, 114b can be disposed upon or within a semiconductor substrate (not shown) along with electronic circuits described in figures below.

A structure 302 can surround and hold the magnetic field sensor 102. In some embodiments, the structure 302 is not ferromagnetic.

It will be understood that the magnetic field sensing elements 114a, 114b experience a magnetic field generated by the permanent magnet 116, but the magnetic field experienced by the magnetic field sensing elements 114a, 114b varies in magnitude and in angle due to the presence of the ferromagnetic target object 104. Thus, if a relative location of the ferromagnetic target object 104 and the magnetic field sensor 102 changes, then an output signal from the magnetic field sensor 102 will change. In particular, if the relative location of the ferromagnetic target object 104 and the magnetic field sensor 102 changes in a vertical direction on the page (i.e., in a direction of the axis 108 of FIG. 1), output signals from the two magnetic field sensing elements 114a, 114b will change. Exemplary electronic circuits that process signals from the magnetic field sensing elements 114a, 114b are described below in conjunction with FIGS. 9 and 10.

In conventional gear tooth sensor arrangements, a different ferromagnetic target object, e.g., a gear, is used, and the magnetic field sensor senses passing ones of the gear teeth. However, in the arrangement of FIG. 3, the ferromagnetic target object 104 is not a gear and does not have gear teeth. It will be understood that, for a fixed relative location of the ferromagnetic target object 104 and the magnetic field sensor 102, a signal from the magnetic field sensor 102 is a DC signal, (but can be thereafter encoded in one of a variety of ways, including, but not limited to, a pulse width modulated (PWM) signal described more fully below, or a SENT format). When the relative location of the magnetic field sensor 102 and the ferromagnetic target object 104 changes in a direction of the axis 108, then the DC signal from the magnetic field sensor 104 changes accordingly. In other words, the signal is not a fully DC signal, but can change if the relative location of the magnetic field sensor 102 and the ferromagnetic target object 104 changes.

The magnetic field sensing elements 114a, 114b can be used in a differential arrangement, which takes a difference of electrical signals generated by the two magnetic field sensing element 114a, 114b. While two magnetic field sensing elements 114a, 114b are shown, in other embodiments here and below, there can be more than two magnetic field sensing elements.

In other embodiments here and below, there can be only one magnetic field sensing element, and the magnetic field sensor 102 does not operate in a differential arrangement. However, advantages of a differential arrangement will be understood, and include, but are not limited to, rejection of common mode noise.

While a V-shaped groove 106 is shown, in other embodiments, the groove 106 can have other shapes. In some embodiments the groove 106 has a flat bottom. In other embodiments, ferromagnetic surfaces (i.e., sides) of the groove 106 are not straight, but are curved. In other embodiments, the groove 106 is not symmetrical and the two ferromagnetic surfaces of the groove have different angles and/or different dimensions.

Figure 4:
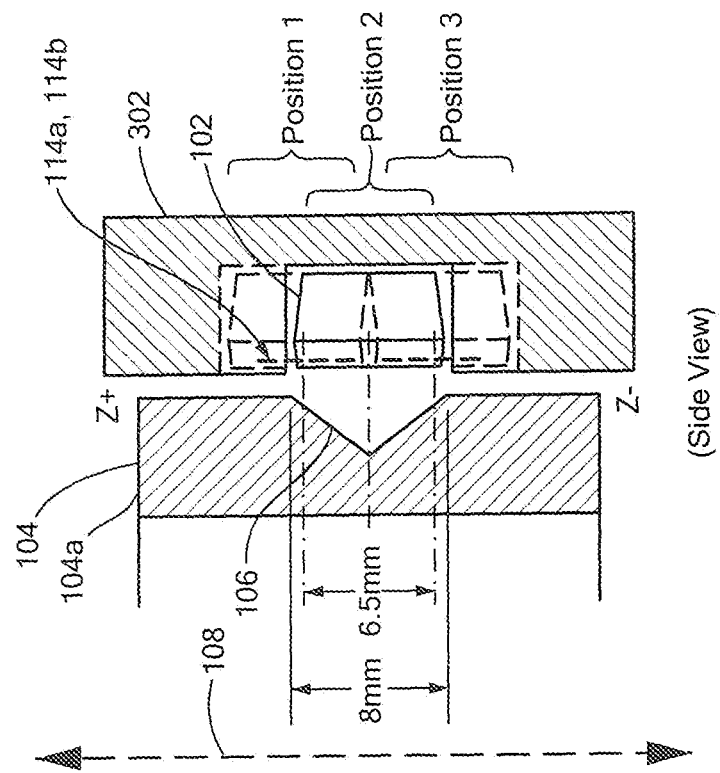
FIG. 4 is another cross-sectional view of the target object and magnetic field sensor of FIG. 1.

Exemplary sizes are shown in FIGS. 3 and 4. However, the sizes can be greater than or less than the sizes that are shown.

Referring now to FIG. 4, in which like elements of FIG. 1 are shown having like reference designations, the magnetic field sensor is shown in three different locations that are vertically oriented on the page. Similarly, the ferromagnetic target object 104 could instead be shown in three different locations.

The two magnetic field sensing elements 114a, 114b are shown simultaneously in the three locations, resulting in the appearance of six magnetic field sensing elements.

Figure 5:
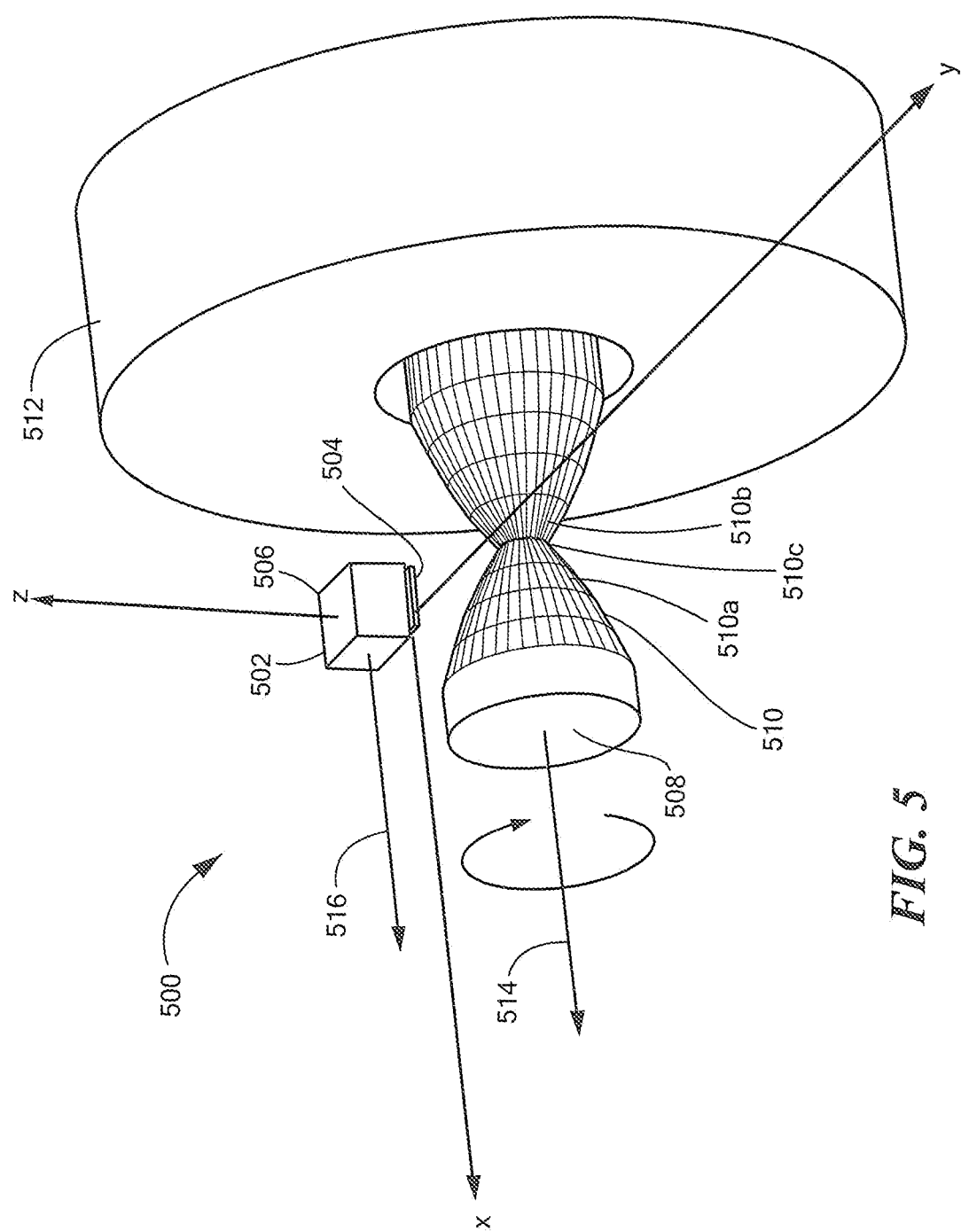
FIG. 5 is a perspective pictorial diagram showing a target object having a circumferential groove (i.e., channel), and a magnetic field sensor proximate to the groove.

Referring now to FIG. 5, a sensing arrangement 500 can include a magnetic field sensor 502 disposed proximate to a ferromagnetic target object 508. The magnetic field sensor 502 can include a back biasing magnet 506 and two magnetic field sensing elements (not show) disposed upon a substrate 504 disposed between the ferromagnetic target object 508 and the back biasing magnet 506.

The ferromagnetic target object 508 can include a circumferential groove 510. The groove 510 can include a first ferromagnetic surface (i.e., side) 510a, a second ferromagnetic surface (i.e., side) 510b, and a vertex 510c between the first and second ferromagnetic surfaces. The first and second ferromagnetic surfaces 510a, 510b can be straight or curved, and are shown here to be curved in two dimensions. Single dimension curvatures are also possible. Continuous or piecewise (i.e., stepped) curvatures in one or two dimensions are also possible. The area of the vertex 510c need not be a sharp point, but in other embodiments, can be a rounded or a flat region.

The first and second ferromagnetic surfaces 510a, 510b have different first and second different slopes. In some embodiments, slopes of the two ferromagnetic surfaces 510a, 510b at equal distances from the vertex 510c have equal but opposite slopes. However, as described more fully below in conjunction with FIGS. 10 and 11, the slopes need not be equal and need not be opposite.

A structure 512 can surround the ferromagnetic target object 508. In some embodiments, the structure 512 is not ferromagnetic.

The ferromagnetic target object 508 can be configured to move along a movement axis 514 parallel to an x-axis and passing through the ferromagnetic target object 508.

The ferromagnetic target object 508 can also be configured to rotate about a rotation axis the same as the movement axis 514, in which case, the groove 510 can circumscribe the ferromagnetic target object 508 and the groove can be curved and can be symmetrical about the ferromagnetic target object 508.

The ferromagnetic target object 508 can be representative of a structure used in an automotive application.

Alternatively or in combination, the magnetic field sensor 502 can be configured to move along a movement axis 516, also parallel to the x-axis.

Figure 6:
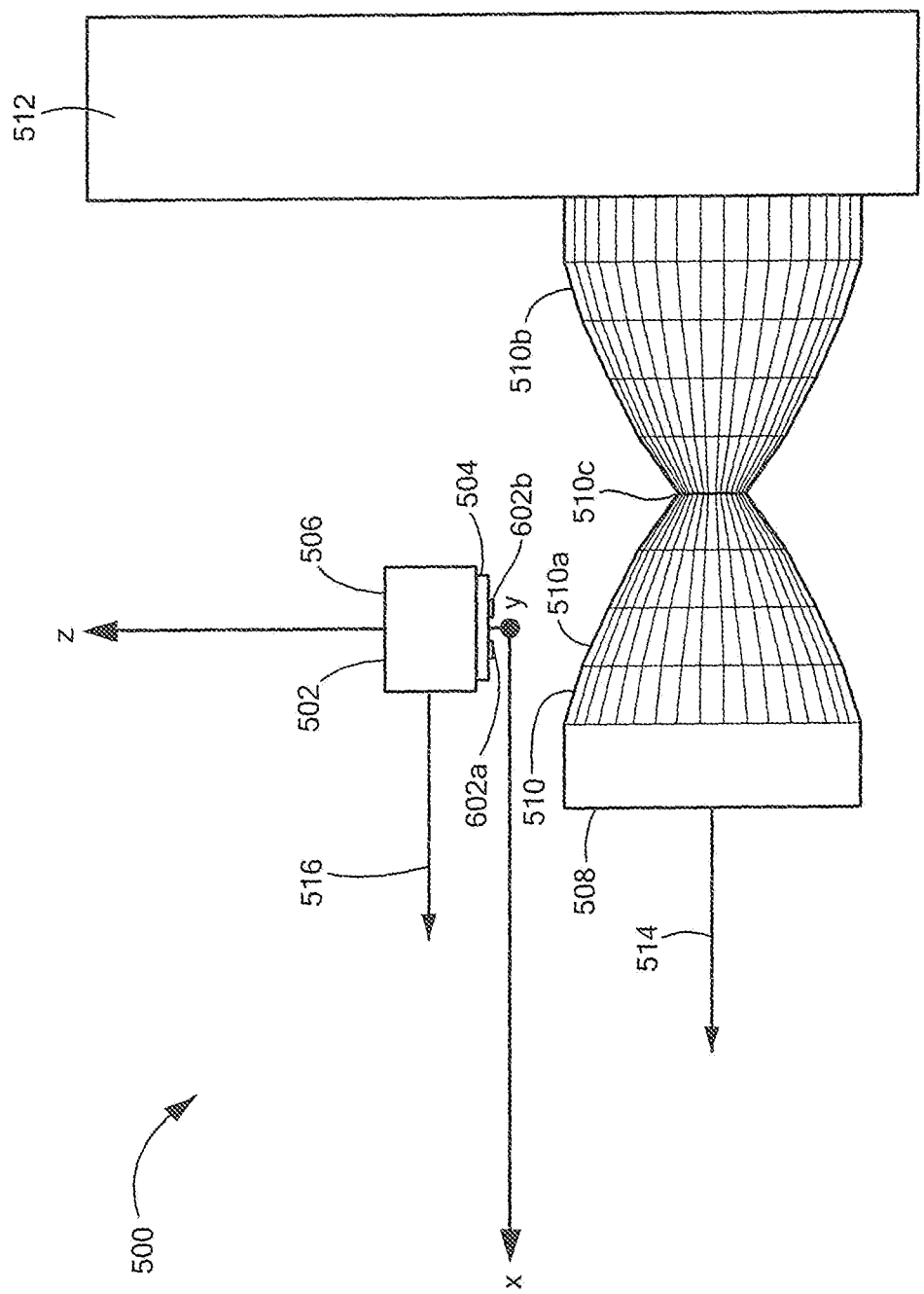
FIG. 6 is a side view pictorial diagram of the target object in the magnetic field sensor of FIG. 5.

Referring now to FIG. 6, in which like elements of FIG. 5 are shown having like reference designations, the substrate 504 can have disposed thereon or therein two magnetic field sensing elements 602a, 602b. As described above in conjunction with FIG. 1, the two magnetic field sensing elements 602a, 602b are arranged as shown, such that a line between the two magnetic field sensing elements 602a, 602b is parallel to the x-axis, parallel to the movement axis 514 (or 516), and perpendicular to the vertex 510c (e.g., corner) of the groove 510. However, in other embodiments, the line between the two magnetic field sensing elements 602a, 602b can be at another angle so long as the line is not perpendicular to the x-axis in an x-y plane. For example, the line between the two magnetic field sensing elements 602a, 602b can be within about +/−seventy-five degrees of parallel to the x-axis in the x-y plane. However, angles within about +/−twenty degrees are preferred. Some tilt in the x-z plane is also possible. In some embodiments, the line between the two magnetic field sensing elements 602a, 602b can tilt relative to the x-z plane away from the x-y plane by up to +/−thirty degrees. However, in some embodiments, a tilt of thirty degrees in the x-z plane may result in contact between the magnetic field sensor 502 and the target object 508, and thus, a tilt of less than about +/−five degrees in the x-z plane is preferred.

Some tilt in the y-z plane is also possible, for example, up to about +/−thirty degrees.

Figure 7:
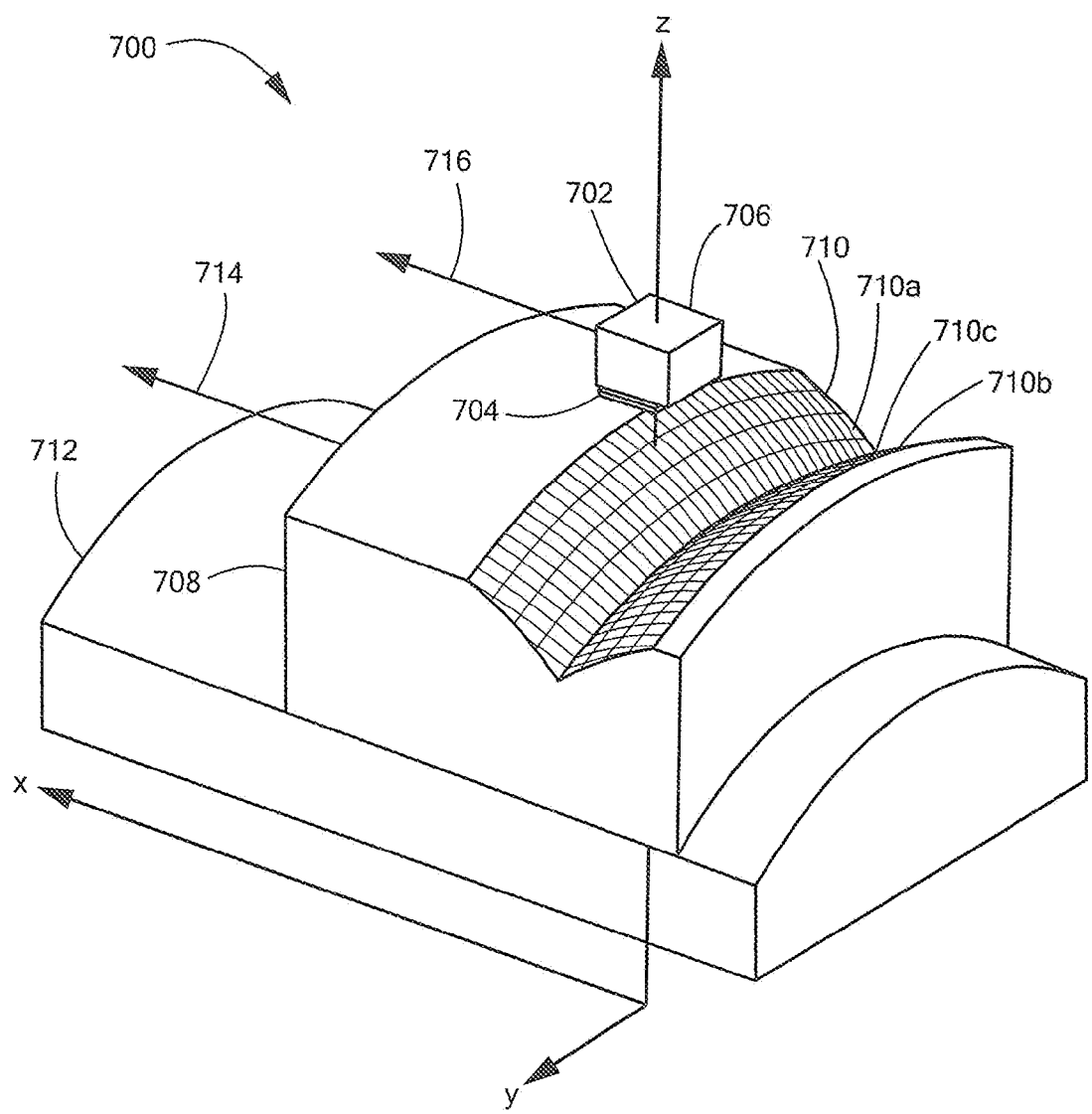
FIG. 7 is perspective pictorial diagram showing another target object having a groove (i.e., a channel), and a magnetic field sensor proximate to the groove.

Referring now to FIG. 7, a sensing arrangement 700 can include a magnetic field sensor 702 disposed proximate to a ferromagnetic target object 708. The magnetic field sensor 702 can include a back biasing magnet 706 and a substrate 704 disposed between the ferromagnetic target object 708 and the back biasing magnet 706.

The ferromagnetic target object 708 can include a groove 710 having first and second ferromagnetic surfaces (i.e., sides) 710a, 710b joined at a vertex 710e. The first and second ferromagnetic surfaces 710a, 710b, respectively, of the groove 710 can be straight or curved and are shown here to be curved.

The first and second ferromagnetic surfaces 710a, 710b have different first and second different slopes in an x-z plane. In some embodiments, slopes of the two ferromagnetic surfaces 710a, 710b at equal distances from the vertex 710c have equal but opposite slopes. However, the slopes need not be equal and need not be opposite.

A structure 712 can surround or be under the ferromagnetic target object 708. In some embodiments, the structure 712 is not ferromagnetic.

The ferromagnetic target object 708 can be configured to move along a movement axis 714 parallel to an x-axis. The ferromagnetic target object 708 can be representative of a structure used in an automotive application. The ferromagnetic target object 708 can be stationary in rotation. For such embodiments where the ferromagnetic target object 708 is stationary in rotation, it should be understood that the groove 710 need not be circumferential about the ferromagnetic target object, but need only be in a localized region proximate to the magnetic field sensor 702.

In other arrangements, the magnetic field sensor can be configured to move along a movement axis 716 parallel to the x-axis.

Figure 8:
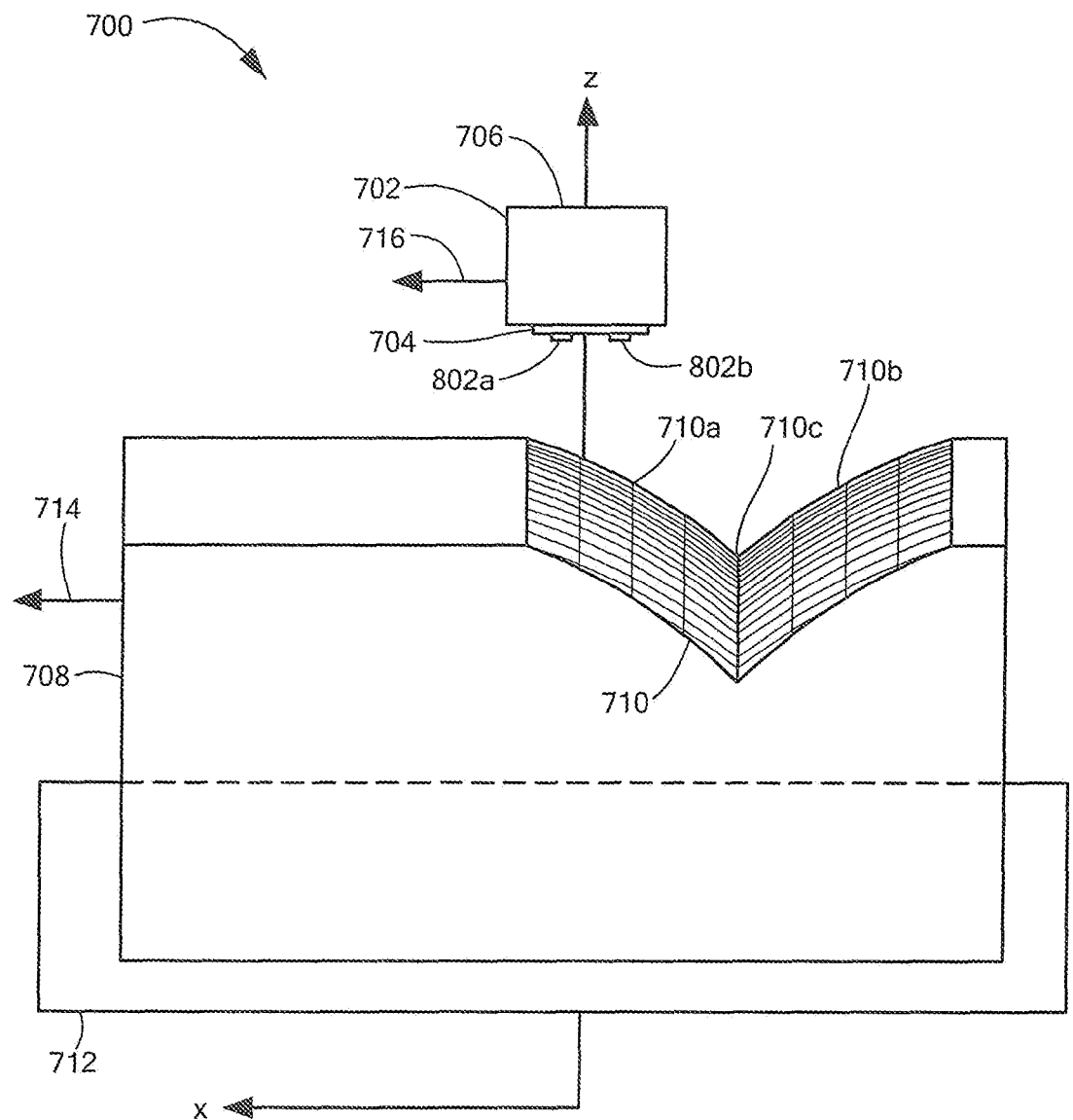
FIG. 8 is a side view pictorial diagram of the target object and the magnetic field sensor of FIG. 7.

Referring now to FIG. 8, in which like elements of Ha 7 are shown having like reference designations, the substrate 704 can have disposed thereon or therein two magnetic field sensing elements 802a, 802b. As described above in conjunction with FIG. 6, the two magnetic field sensing elements 802a, 802b are arranged as shown, such that a line between the two magnetic field sensing elements 802a, 802b is parallel to the x-axis, parallel to the movement axis 714, and perpendicular to the vertex 710c (e.g., corner) of the groove 710. However, in other embodiments, the line between the two magnetic field sensing elements 802a, 802b can be at another angle so long as the line is not perpendicular to the x-axis in an x-y plane. For example, the line between the two magnetic field sensing elements 802a, 802b can be within about +/−seventy-five degrees of parallel to the x-axis in the x-y plane. However, angles within about +/−twenty degrees are preferred. Some tilt in the x-z plane is also possible. In some embodiments, the two magnetic field sensing elements 802a, 802b can tilt in the x-z plane away from the x-y plane by up to +/−thirty degrees. However, in some embodiments, a tilt of thirty degrees in the x-z plane may result in contact between the magnetic field sensor 702 and the target object 708, and thus, a tilt of less than about +/−five degrees in the x-z plane is preferred.

Some tilt in the y-z plane is also possible, for example, up to about +/−thirty degrees.

Figure 9:
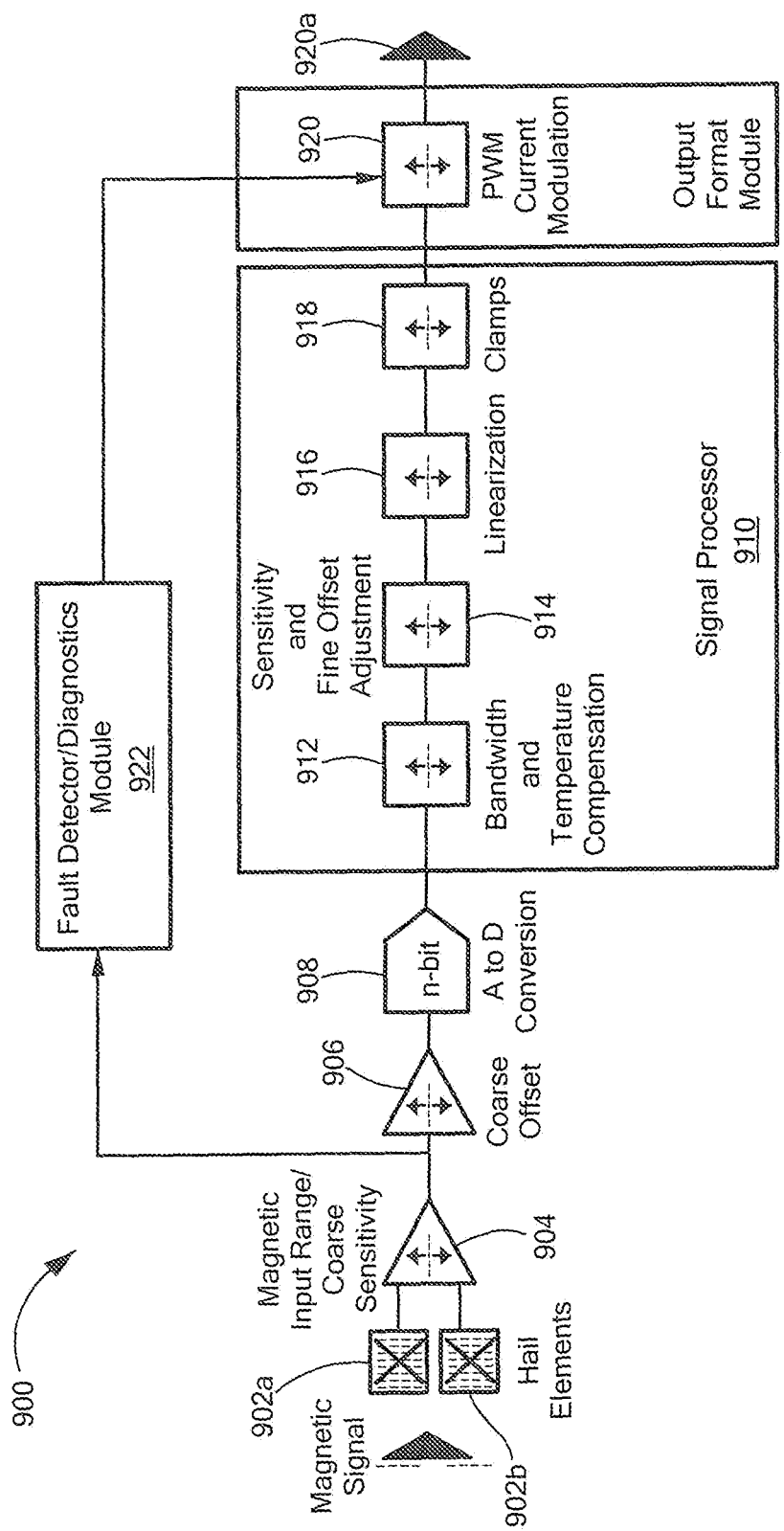
FIG. 9 is a block diagram of an exemplary electronic circuit that can be used as part of the magnetic field sensors of figures above.

Referring now to FIG. 9, an exemplary electronic circuit 900 can be disposed upon a substrate in any of the magnetic field sensors described above or below. Electronic circuit 900 can include or be coupled to two magnetic field sensing elements 902a, 902b, which can be the same as or similar to any of the magnetic field sensing elements described above.

The two magnetic field sensing elements 902a, 902b experience magnetic field in a back biased arrangement. Referring briefly to FIG. 3, the two magnetic field sensing elements 114a, 114b can experience the same magnetic field when the magnetic field sensor is centered over the groove 106 as shown. However, when the relative location of the ferromagnetic target object 104 and the magnetic field sensor 102 changes in a direction vertical on the page, then the two magnetic field sensing elements 114a. 114b experience different magnitudes of magnetic fields.

Referring again to FIG. 9, it will be understood that the two magnetic field sensing elements 902a, 902b can generate undesirable DC offsets, which may be the same or different, and also, the two magnetic field sensing elements 902a, 902b can have two different sensitivities, which may be undesirable.

Signals from the two magnetic field sensing elements 902a. 902b can be received by a differential amplifier 904.

Associated with the differential amplifier 904 can be certain adjustments made during a calibration period of the electronic circuit 900. For example, the differential amplifier 904 can include input range and coarse sensitivity adjustments operable to make the two magnetic field sensing elements 902a, 902b appear to have the same sensitivity.

The differential amplifier 904 is configured to generate an amplified signal, which can be received by a coarse offset voltage adjustment circuit 906. The coarse offset adjustment circuit 906 can be configured to generate an offset adjusted signal, and is operable to make the two magnetic field sensing elements 902a, 902b appear to have the same DC offset voltage, or, a zero offset voltage.

An n-bit analog-to-digital (A/D) converter 908, for example, a 14-bit A/D, is coupled to receive the offset corrected signal and configured to generate a digital signal.

The digital signal is received by a signal processor 910. The signal processor 910 can include a bandwidth and temperature compensation module 912. The bandwidth and temperature compensation module 912 can be configured to filter (e.g., with a selectable bandwidth) and temperature compensate the offset corrected signal. The signal processor 910 can also include a sensitivity and fine offset adjustment module 914 configured to provide a fine sensitivity and offset adjustment. The signal processor 910 can also include a linearization module 916 coupled to the sensitivity and fine offset adjustment module 914. The linearization module 916 can be configured to generate in a linearized output signal from the linearization module 916, linear with respect to relative location along a movement axis between the two magnetic field sensing elements 902a, 902b and a ferromagnetic target object. The signal processor 910 can also include a clamping module 918 coupled to receive the linearized output signal and configured to generate a clamped output signal which is a version of the linearized output signal restricted to a particular range of values for reasons described below.

In some other embodiments, the magnetic field sensor 900 does not include the linearization module 916, and instead, the clamping module 918 couples to upstream circuits directly.

An output format module 920 can be coupled to receive the clamped signal and configured to generate an output signal 920a proportional to values of the clamped signal. In some embodiments, the output signal 920a is a pulse width modulated (PWM) signal with a duty cycle proportional to values of the clamped signal.

In some embodiments, the output signal 920a form the magnetic field sensor 900 is a current signal carried on a common wire with a supply voltage to the magnetic field sensor 900 that powers the magnetic field sensor 900.

In some embodiments, certain ranges of duty cycle of the PWM output signal are used for other purposes. For example, duty cycles from zero to ten percent and duty cycles from ninety to one hundred percent can be used to signal fault conditions of the electronic circuit 900. Thus, in some embodiments the clamping module restricts values of clamped signal to those values that would generate duty cycles in a range from about ten to about ninety percent. However, other duty cycle ranges can also be used.

To this end, the magnetic field sensor 900 can include a fault detector module 922 that can provide a fault signal to the output format module 920. Shown here, the fault detector/diagnostics module 922 is coupled to the output of the differential amplifier 904 and can be operable to detect invalid levels of the amplified signal. However, in other embodiments, the fault detector/diagnostics module 922 can be coupled to other parts of the magnetic field sensor 900 and can be operable to detect other types of error conditions.

More generally, the fault detector/diagnostics module 922 can include a diagnostics module that monitors signal path validity and can communicate any fault condition to the output. This is particularly important for safety related applications requiring conformity to ASIL (Automotive Safety Integrity Level).

For embodiments in which the two magnetic field sensing elements 902a, 902b are Hall effect elements, the electronic circuit 900 can include circuitry (not shown) to chop (or current spin) the Hall effect elements. Current spinning will be understood to be a circuit technique that can result in lower apparent offset voltages of the Hall elements 902a, 902b.

While the output format module 920 is described to generate a PWM output signal, in other embodiments, the output signal can be in another format, for example, a SENT format or an I2C format.

Figure 10:
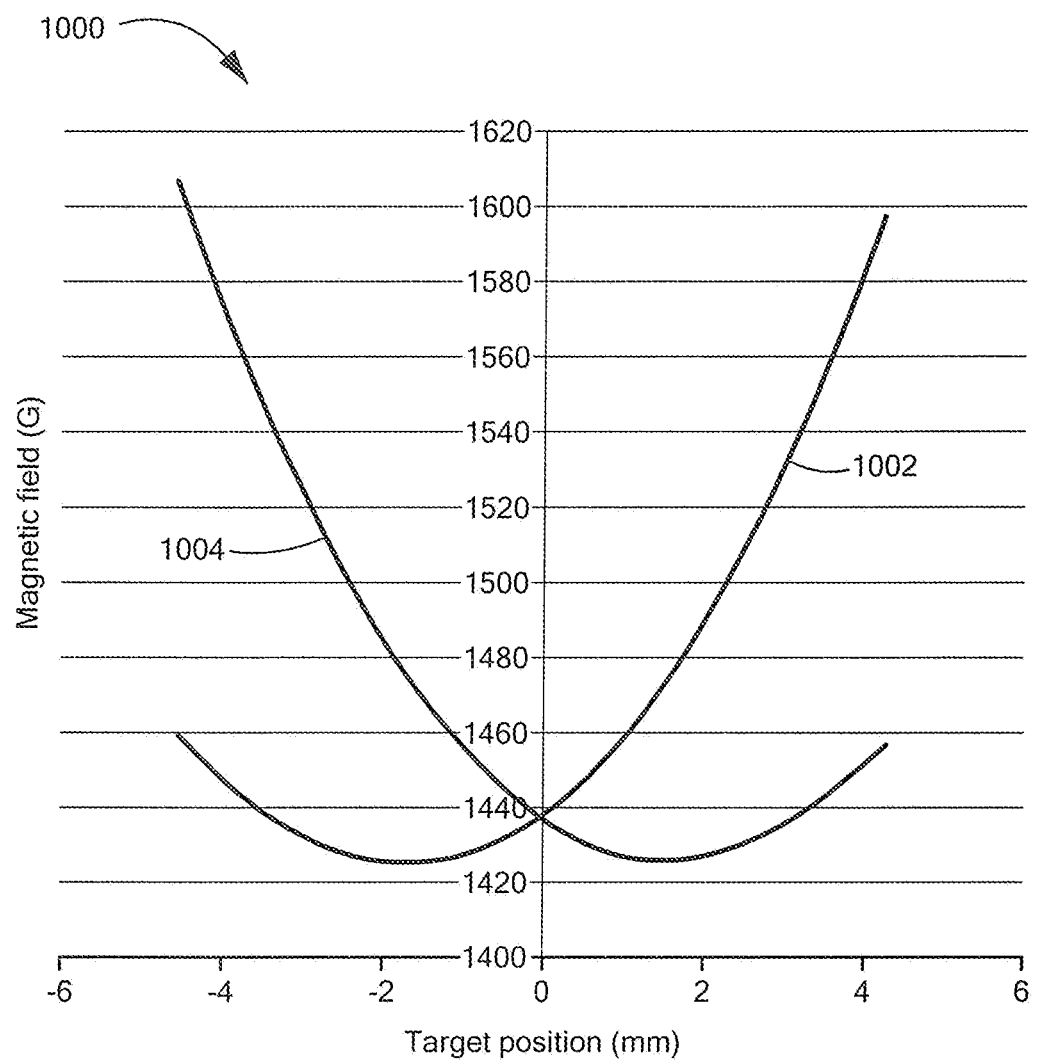
FIG. 10 is a graph showing two separate output signals from two Hall effect elements versus relative location of a ferromagnetic target object, wherein the two Hall effect elements can form part of the magnetic field sensors of figures above.

Referring now to FIG. 10, a graph 1000 has a horizontal axis with a scale in units of relative location of a target object used in automotive applications and one of the magnetic field sensors described above. The graph 1000 also has a vertical axis with a scale in units of magnetic field in Gauss. A curve 1002 is representative of an output signal generated by one of the magnetic field sensing elements of the pairs of magnetic field sensing elements described above as a relative location of the ferromagnetic target object and the magnetic field sensor changes along a movement axis (or alternatively, along a movement line, which can be curved). A curve 1004 is representative of an output signal from the other one of the magnetic field sensing elements of the pairs of magnetic field sensing elements described above as the relative location of the target object and the magnetic field sensor changes along the movement axis.

It will be apparent that the output signals from the two magnetic field sensing elements need not be (but can be) linear with regard to the relative location. It will also be apparent that output signals generated by the two magnetic field sensing elements tend to move in opposite directions when the relative location of the ferromagnetic target object and the magnetic field sensor changes along the movement axis.

Figure 11:
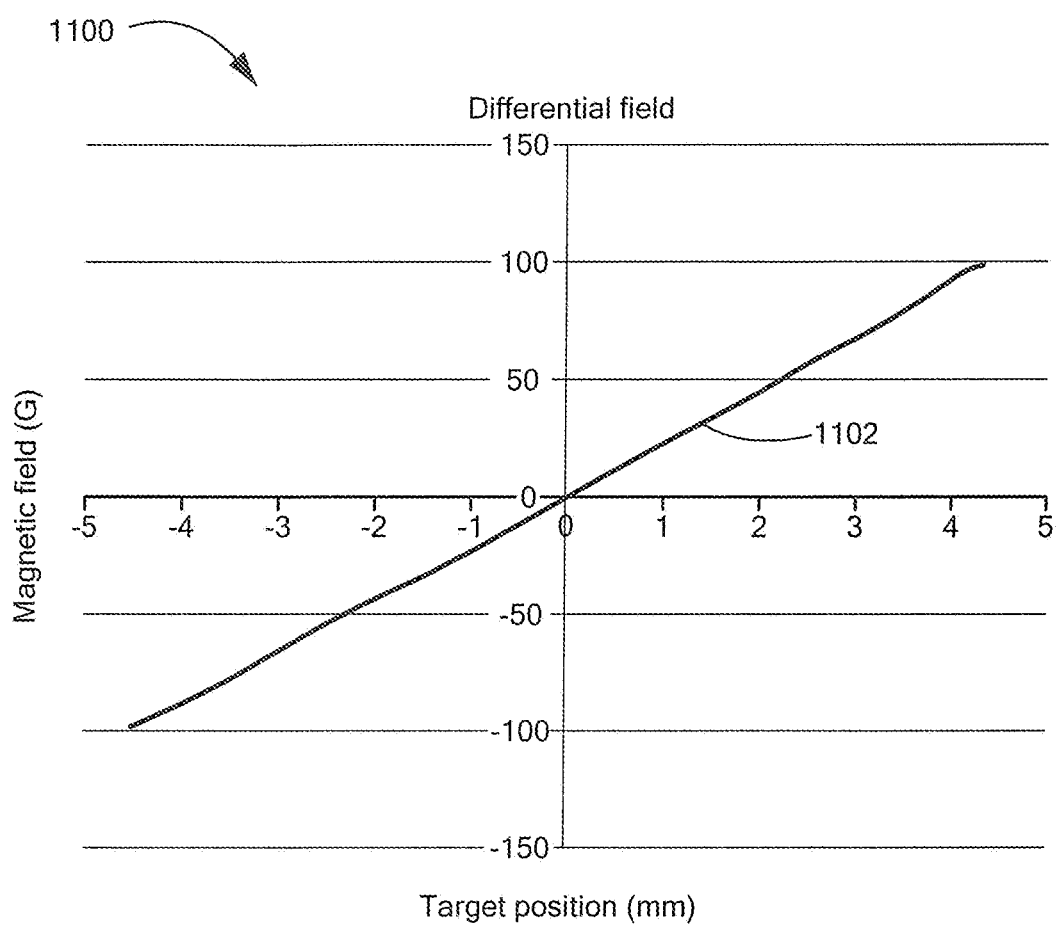
FIG. 11 is a graph showing a difference of the two separate output signals from the two Hall effect elements shown in FIG. 11.

Referring now to FIG. 11, a graph 1100 has a horizontal axis with a scale in units of relative location of the target object and the magnetic field sensors described above. The graph 1100 also has a vertical axis with a scale in units of magnetic field in Gauss representative of a differential magnetic field sensed by the two magnetic field sensing elements. A curve 1102 is representative of a difference of magnetic fields experienced by two magnetic field sensing elements, for example, the magnetic field sensing elements 902a, 902b of FIG. 9 located relative of a ferromagnetic target object. Therefore, the curve 1102 is representative of an output signal generated by taking a difference between the two signals 1002, 1004 of FIG. 10 as may be taken, for example, by the differential amplifier 904 of FIG. 9. In some embodiments, the curve 1102 is linear with regard to the relative location of the magnetic field sensor and the target object. However, the curve 1102 need not be linear.

It will be understood that the linearity of the curve 1102 can be influenced by a variety of circuits and factors. For example, the linearity can be affected by the linearization module 916 of FIG. 9. The linearity can also be affected by shapes of the ferromagnetic surfaces and vertexes of the above-described grooves, for example, shapes of the ferromagnetic surfaces 510a, 510b and vertex 510c of FIGS. 5 and 6, and also by a shape of a ridge described below in conjunction with FIG. 12. Thus, in some embodiments, linearization is controlled by the shapes of the grooves (and ridges), and the linearization module 916 is not needed.

In some embodiments, linearity of the curve 1102 may not be desirable. For example, it may be desirable to have enhanced accuracy within certain regions of the relative movement between the ferromagnetic target object in the magnetic field sensor along a movement axis, in which case, it may be desirable for the curve 1102 to have a steep slope in some portions and a shallow slope in other portions. Nonlinearity can be affected by the same variety of circuits and factors described above for linearity.

From FIGS. 10 and 11, it should be apparent that all magnetic field sensors described herein can sense movement along a movement line when there is only one, and not two, ferromagnetic surfaces upon a ferromagnetic target object. Essentially, the magnetic field sensors can operate with movement along the movement line from target location zero to the right in FIGS. 10 and 11, or from target location zero to the left. Thus, all magnetic field sensors described herein are responsive to at least one surface upon the ferromagnetic target object.

For embodiments that have two ferromagnetic surfaces, i.e., first and second ferromagnetic surfaces, in some two-surface embodiments, the first and second ferromagnetic surfaces have first and second slopes relative to the movement line, wherein the first slope and the second slope have opposite signs and equal angles relative to the movement line. This arrangement is shown above, for example, in FIGS. 1-8, and also FIGS. 12, 13, and 14 below.

In other two-surface embodiments, the first and second ferromagnetic surfaces have first and second slopes relative to the movement line, wherein the first slope and the second slope have opposite signs and unequal angles relative to the movement line.

In other two-surface embodiments, the first and second ferromagnetic surfaces have first and second slopes relative to the movement line, wherein the first slope and the second slope have equal signs and unequal angles relative to the movement line. For these embodiments, one of the slopes relative to the movement line can be zero.

Figure 12:
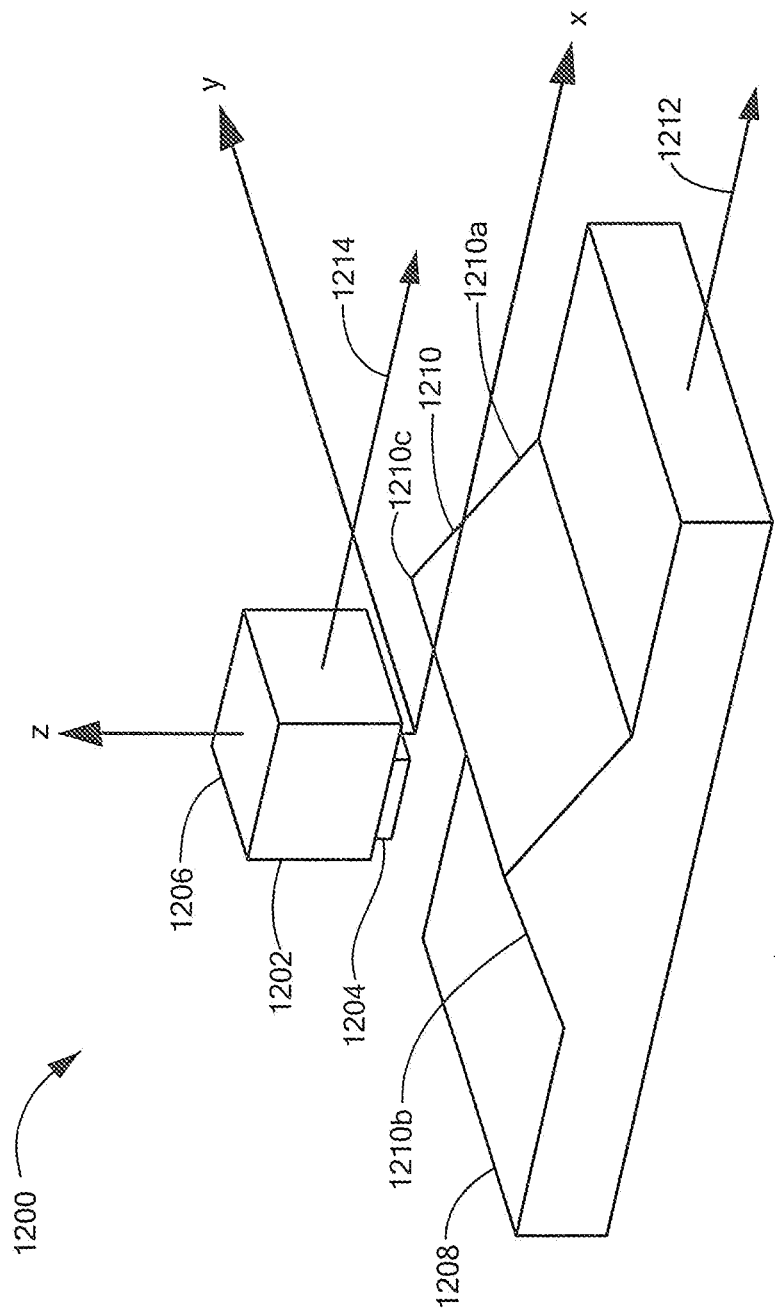
FIG. 12 is a perspective pictorial diagram showing another target object having a ridge, and a magnetic field sensor proximate to the ridge.

Referring now to FIG. 12, a sensing arrangement 1200 can include a magnetic field sensor 1202 disposed proximate to a ferromagnetic target object 1208. The magnetic field sensor 1202 can include a back biasing magnet 1206 and two magnetic field sensing elements (not shown) disposed upon a substrate 1204 disposed between the ferromagnetic target object 1208 and the back biasing magnet 1206.

The ferromagnetic target object 1208 can include a ridge 1210. The ridge 1210 can include a first ferromagnetic surface, (i.e., side) 1210a, a second ferromagnetic surface (i.e., side) 1210b, and a vertex 1210c between the first and second ferromagnetic surfaces. The first and second ferromagnetic surfaces 1210a, 1210b can be straight or curved, and are shown here to be straight. The area of the vertex 1210c need not be a sharp point, but in other embodiments, can be a rounded or a flat region.

The first and second ferromagnetic surfaces 1210a, 1210b have different first and second different slopes in an x-z plane. In some embodiments, slopes of the two ferromagnetic surfaces 710a, 710b at equal distances from the vertex 710c have equal but opposite slopes. However, the slopes need not be equal and need not be opposite.

The ferromagnetic target object 1208 can move along a movement axis 1211, or the magnetic field sensor 1202 can move along a movement axis 1214, or both. The movement axes 1211, 1214 are parallel to an x-axis.

A structure (not shown) can surround the ferromagnetic target object 1208.

The ferromagnetic target object 1208 (or the magnetic field sensor 1202) can be configured to move parallel to an x-axis, and along a movement axis. In some embodiments, the ferromagnetic target object 1208 can also be configured to rotate about an axis parallel to the x-axis, in which case, the ridge 1210 can circumscribe the ferromagnetic target object 1208 and the ridge 1210 can be curved and can be can be symmetrical circumscribing the ferromagnetic target object 1208. As described above in conjunction with FIGS. 7 and 8, for embodiments in which the target object 1208 does not rotate or spin, the ridge 1210 need not circumscribe the target object 1208 and can be localize to a region of the target object 1208 that is proximate the magnetic field sensor 1202.

In other arrangements, instead or in combination, the magnetic field sensor 1202 can move in a direction parallel to the x-axis and along a movement axis 1214.

Operation of the sensing arrangement 1200 will be understood from discussion above in conjunction with FIGS. 1-11. Alignment of magnetic field sensing elements disposed upon the substrate 1304 relative to the x-axis can be the same as or similar to alignments described above in other figures.

Figure 13:
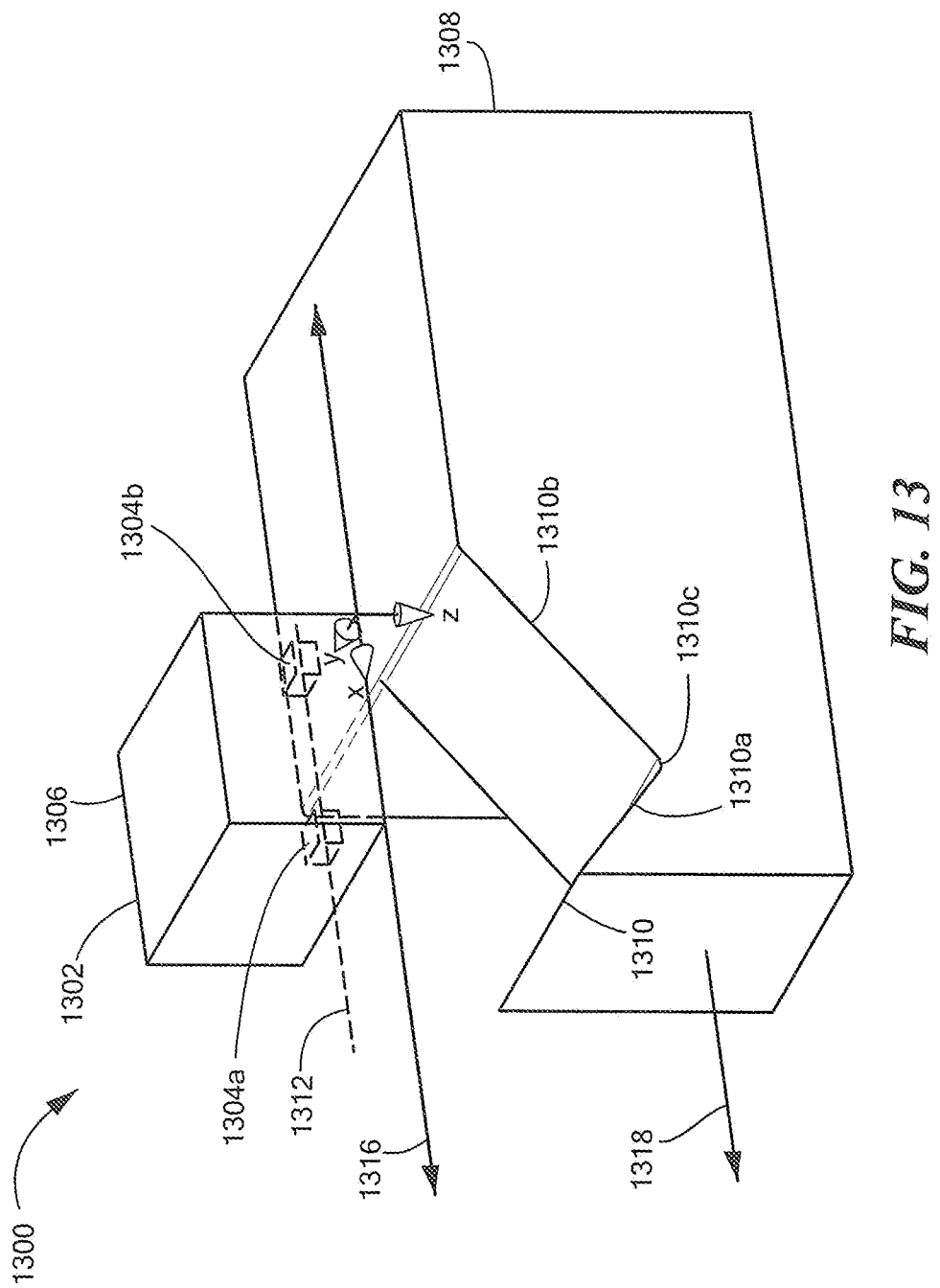
FIG. 13 is perspective pictorial diagram showing another target object having a groove (i.e., a channel), and a magnetic field sensor proximate to the groove.

Referring now to FIG. 13, a sensing arrangement 1300 can include a magnetic field sensor 1302 disposed proximate to a ferromagnetic target object 1308. The magnetic field sensor 1302 can include a back biasing magnet 1306 and two or more, here two, magnetic field sensing elements 1304a, 1304b disposed upon a substrate (not shown) disposed between the ferromagnetic target object 1308 and the back biasing magnet 1306.

The ferromagnetic target object 1308 can include a groove 1310. The groove 1310 can include a first ferromagnetic surface (i.e., side) 1310a, a second ferromagnetic surface (i.e., side) 1310b, and a vertex 1310c between the first and second ferromagnetic surfaces. The first and second ferromagnetic surfaces 1310a, 1310b can be straight or curved, and are shown here to be straight. The first and second ferromagnetic surfaces 1310a, 1310b can be the same length (dimension perpendicular to vertex 1310c) or different lengths, and are shown here to have different lengths. The area of the vertex 1310c need not be a sharp point, but in other embodiments, can be a rounded or a flat region.

The first and second ferromagnetic surfaces 1310a, 1310b have different first and second different slopes in an x-z plane. In some embodiments, slopes of the two ferromagnetic surfaces 1310a, 1310b at equal distances from the vertex 1310c have equal but opposite slopes. However, the slopes need not be equal and need not be opposite.

The ferromagnetic target object 1308 can be configured to move along a movement axis 1318 (parallel to an x-axis) passing through the ferromagnetic target object 1308.

In some embodiments, the ferromagnetic target object 1308 can also be configured to rotate about a rotation axis the same as the movement axis 1318, in which case, the groove 1310 can circumscribe the ferromagnetic target object 1308 and the groove can be curved and can be symmetrical about the ferromagnetic target object 1308.

Alternatively or in combination, the magnetic field sensor 1302 can be configured to move along a movement axis 1316, also parallel to the x-axis.

A line 1312 passing through the two magnetic field sensing elements 1304a, 1304b can be parallel to the movement axis 1318, parallel to the movement axis 1316, or both. However, angles other than parallel are also possible, as described above in conjunction with FIGS. 3, 6, and 8.

Figure 14:
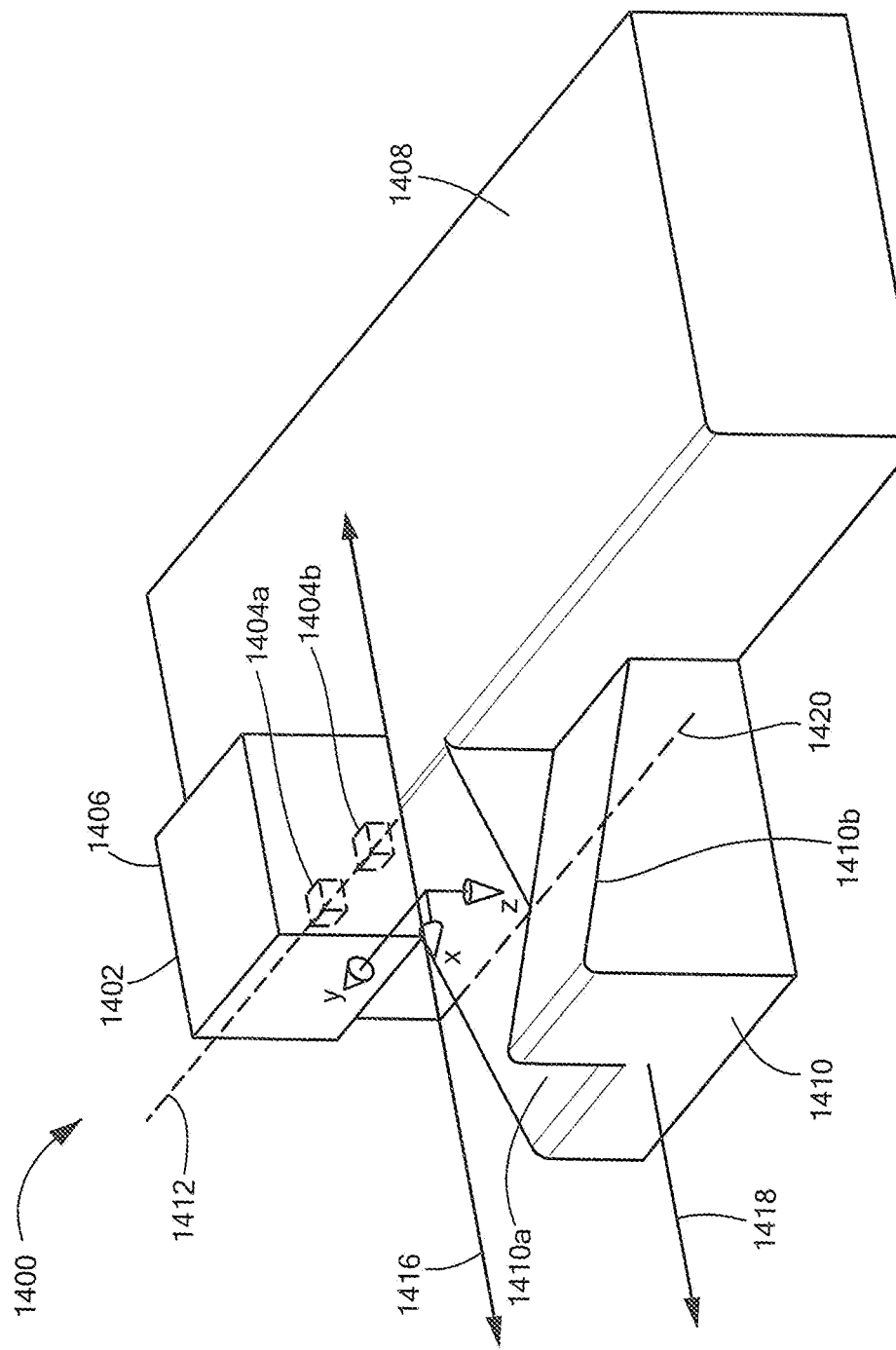
FIG. 14 is perspective pictorial diagram showing another target object having two surfaces with opposite slopes, and a magnetic field sensor proximate to the two surfaces.

Referring now to FIG. 14, a sensing arrangement 1400 can include a magnetic field sensor 1402 disposed proximate to a ferromagnetic target object 1408. The magnetic field sensor 1402 can include a back biasing magnet 1406 and two or more, here two, magnetic field sensing elements 1404a, 1404b disposed upon a substrate (not shown) disposed between the ferromagnetic target object 1408 and the back biasing magnet 1406.

The ferromagnetic target object 1408 can include a structure 1410. The structure 1410 can include a first ferromagnetic surface 1410a with a first slope, a second ferromagnetic surface 1410b with a second different slope. The ferromagnetic surfaces 1410a, 1410b can be proximate or distal, here shown to be proximate. A line 1420 can rest upon the first ferromagnetic surface 1410a and upon the second ferromagnetic surface 1410b. In other words, the line 1420 can be parallel to both of the first and second ferromagnetic surfaces 1410a, 1410b. More generally, the line 1420 can be a tangent line tangent to the first and second ferromagnetic surfaces 1410a, 1410b, for example, where at least one of the first ferromagnetic surface 1410a or the second ferromagnetic surface 1410b is curved.

In some embodiments, the structure 1410 is ferromagnetic and the rest of the target object 1408 is not ferromagnetic.

A dimension of the first ferromagnetic surface 1410a in a direction perpendicular to the line 1420 can be the same as or different than a dimension of the second ferromagnetic surface 1410b in the direction perpendicular to the line 1420.

The first and second ferromagnetic surfaces 1410a, 1410b have first and second different slopes in an x-z plane. In some embodiments, slopes of the first and second ferromagnetic surfaces 1410a, 1410b have equal but opposite slopes. However, the slopes need not be equal and need not be opposite. For example, in some other embodiments, as described above in conjunction with FIGS. 10 and 11, the first and second slopes can both be positive or both be negative, but with different slopes. In some embodiments, one of the first or second ferromagnetic surfaces 1410a, 1410b can be absent. In some embodiments, one of the first or second ferromagnetic surfaces 1410a, 1410b can have a zero slope.

The first magnetic field sensing element 1404a can be disposed over and proximate to the first ferromagnetic surface 1410a and the second magnetic field sensor 1404b can be disposed over and proximate to the second ferromagnetic surface 1410b.

The first and second ferromagnetic surfaces 1410a, 1410b can be straight or curved, and are shown here to be straight. The first and second ferromagnetic surfaces 1410a, 1410b can be the same length or different lengths, and are shown here to have the same lengths.

The ferromagnetic target object 1408 can be configured to move along a movement axis 1418 parallel to an x-axis and passing through the ferromagnetic target object 1408. The above slopes in the x-z axis can also be slopes of the ferromagnetic surfaces 1410a, 1410b relative to the movement line 1418.

In some embodiments, the ferromagnetic target object 1408 can also be configured to rotate to some extent about a rotation axis the same as the movement axis 1418, in which case, the ferromagnetic surfaces 1410a, 1410b can be curved about the movement axis 1418, and/or in a direction of the y-axis, i.e., curved in one or two dimensions.

Relative movement in a direction of the y-axis results in little change in behavior so long as the magnetic field sensing elements 104a, 104b remain over respective surfaces 1410a, 1410b.

Alternatively or in combination, the magnetic field sensor 1402 can be configured to move along a movement axis 1416, also parallel to the x-axis. The above slopes in the x-z axis can also be slopes of the ferromagnetic surfaces 1410a, 1410b relative to the movement line 1416.

Unlike other embodiments shown above, a line 1412 passing through the two magnetic field sensing elements 1404a, 1404b can be perpendicular to the movement axis 1418, perpendicular to the movement axis 1416, or both. However, angles other than perpendicular are possible.

For example, the line 1412 between the two magnetic field sensing elements 1404a, 1404b can be within about +/−seventy-five degrees of perpendicular to the x-axis (i.e., movement axes 1418, 1416) in the x-y plane. However, angles within about +/−twenty degrees are preferred. Some tilt in the x-z plane, i.e., rotation about the line 1412, is also possible. In some embodiments, the magnetic field sensor 1402 can rotate about the line 1412 between the two magnetic field sensing elements 1404a, 1404b by up to +/−thirty degrees. However, in some embodiments, a rotation of thirty degrees in may result in contact between the magnetic field sensor 1402 and the target object 1408, and thus, a rotation of less than about +/−five degrees is preferred.

Some tilt in the y-z plane is also possible, for example, up to about +/−thirty degrees.

While embodiments shown and described above use two magnetic field sensing elements, in other embodiments, there can be more than two magnetic field sensing elements to provide to or more difference signals that a processed in ways similar to ways described above.

While relative movement between ferromagnetic target objects and magnetic field sensors are described above to be along movement axes, i.e., straight lines, in other embodiments, the relative movement can be along movement lines, which can be curved lines or arcs. The above describe linearization module 916 can account for changes in difference signals from the differential amplifier 904 at different points along the arcs, still resulting in a linear signal at the output of the linearization module 916.

While back-biased arrangements are described herein, for which magnetic field sensing elements disposed are between a magnet generating a DC magnetic field and a ferromagnetic surface, in other embodiments, the magnet for generating the DC magnet field is disposed in a different place, for example to a side of the magnetic field sensing elements so that the magnetic field sensing elements are not between the magnet and the ferromagnetic surface. Arrangements of this type that are used instead as rotation detectors are described, for example, in U.S. patent application Ser. No. 13/946,380, filed Jul. 19, 2013, which is assigned to the assignee of the present invention, and which is incorporated by reference herein in its entirety. In other embodiments, a coil is used in place of a magnet to generate a DC magnetic field. As used herein, a coil is a type of magnet.

In some embodiments, slopes described herein are not ninety degrees relative to movement lines. In some embodiments, slopes are less than about +/−ninety, +/−eighty, +/−seventy, +/−sixty, +/−fifty, +/−forty, +/−thirty, +/−twenty, or +/−ten degrees.

In some embodiments, ferromagnetic target objects shown and described herein can be structures within vehicle transmissions, e.g., automobile transmissions, and therefore, magnetic field sensors described herein can be within or proximate to the vehicle transmissions. In other embodiments, ferromagnetic target objects shown and described herein can be structures within vehicle suspension systems, e.g., automobile suspension systems, and therefore, magnetic field sensors described herein can be within or proximate to the vehicle suspension systems. In vehicle suspension systems, the magnetic field sensors can be used to detect a variety of suspension system characteristics, including, but not limited to, suspension height (static or dynamic, e.g., average) and damper stroke, i.e. amount of movement of a suspension damper. Other applications of similar apparatus and techniques described herein are also possible.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a magnet operable to generate a DC magnetic field; and
first and second magnetic field sensing elements operable to sense first and second influenced magnetic fields, respectively, related to the DC magnetic field but influenced by at least one ferromagnetic surface upon a ferromagnetic target object, wherein the first and second magnetic field sensing elements are disposed proximate to the at least one ferromagnetic surface, wherein the first and second magnetic field sensing elements are also operable to generate corresponding first and second electronic signals related to the first and second influenced magnetic fields, respectively, wherein a difference of amplitudes of the first and second electronic signals is related to a relative location of the magnetic field sensor and the ferromagnetic target object along a movement axis, wherein a change of the relative location is indicative of a relative displacement of the magnetic field sensor and the ferromagnetic object, and wherein the difference of the amplitudes of the first and second electronic signals is not related to a rotation of the ferromagnetic target object about a rotation axis passing through the ferromagnetic target object.

2. The magnetic field sensor of claim 1, wherein the at least one ferromagnetic surface consists of only first and second ferromagnetic surfaces upon the ferromagnetic target object, and wherein the first and second electronic signals are responsive only to the first and second ferromagnetic surfaces, respectively.

3. The magnetic field sensor of claim 2, wherein the first and second ferromagnetic surfaces have first and second slopes relative to the movement axis, wherein the first slope and the second slope have opposite signs and equal angles relative to the movement axis.

4. The magnetic field sensor of claim 2, wherein the first and second ferromagnetic surfaces have first and second slopes relative to the movement axis, wherein the first slope and the second slope have opposite signs and unequal angles relative to the movement axis.

5. The magnetic field sensor of claim 2, wherein the first and second ferromagnetic surfaces have first and second slopes relative to the movement axis, wherein the first slope and the second slope have equal signs and unequal angles relative to the movement axis.

6. The magnetic field sensor of claim 2, wherein the ferromagnetic target object is operable to spin about a rotation axis parallel to the movement axis, wherein the first and second electronic signals are not substantially influenced by the spin.

7. The magnetic field sensor of claim 2, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis.

8. The magnetic field sensor of claim 2, wherein the first and second ferromagnetic surfaces form a groove or a ridge.

9. The magnetic field sensor of claim 8, wherein the first and second ferromagnetic surfaces are flat.

10. The magnetic field sensor of claim 8, wherein at least one of the first ferromagnetic surface or the second ferromagnetic surface is curved in at least one dimension.

11. The magnetic field sensor of claim 8, wherein the first and second ferromagnetic surfaces intersect at a vertex, and wherein a dimension of the first ferromagnetic surface perpendicular to the vertex is different than a dimension of the second ferromagnetic surface perpendicular to the vertex.

12. The magnetic field sensor of claim 2, wherein the first and second ferromagnetic surfaces are proximate surfaces, wherein a straight tangent line is tangent to both of the first and second ferromagnetic surfaces.

13. The magnetic field sensor of claim 12, wherein the first and second ferromagnetic surfaces are flat.

14. The magnetic field sensor of claim 12, wherein at least one of the first ferromagnetic surface or the second ferromagnetic surface is curved.

15. The magnetic field sensor of claim 12, wherein a dimension of the first ferromagnetic surface in a direction perpendicular to the tangent line is different than a dimension of the second ferromagnetic surface in the direction perpendicular to the tangent line.

16. The magnetic field sensor of claim 2, wherein curvatures of the first and second ferromagnetic surfaces are selected to provide an output signal from the magnetic field sensor that is linear with respect to the relative location of the magnetic field sensor and the ferromagnetic target object along the movement axis.

17. The magnetic field sensor of claim 2, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis; and
a linearization module coupled to the differential amplifier, wherein the linearization module is operable to generate a linearized signal that is linearly related to the relative location of the magnetic field sensor and the ferromagnetic target object along the movement axis.

18. The magnetic field sensor of claim 17, further comprising:
a clamping module coupled to the linearization module and operable to generate a clamped signal corresponding to a restricted amplitude range of the linearized signal.

19. The magnetic field sensor of claim 2, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis; and
a clamping module coupled to the differential amplifier and operable to generate a clamped signal corresponding to a restricted amplitude range of the difference signal.

20. The magnetic field sensor of claim 2, wherein the difference of the amplitudes of the first and second electronic signals is linear with respect to the relative location along the movement axis.

21. The magnetic field sensor of claim 2, further comprising:
a linearization module operable to generate a linearized signal indicative of a linearization of the difference of the amplitudes of the first and second electronic signals with respect to the relative location along the movement axis.

22. The magnetic field sensor of claim 1, wherein the ferromagnetic target object is operable to spin about an rotation axis parallel to the movement axis, wherein the first and second electronic signals are not substantially influenced by the spin.

23. The magnetic field sensor of claim 1, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis.

24. The magnetic field sensor of claim 1, wherein the at least one ferromagnetic surface is flat.

25. The magnetic field sensor of claim 1, wherein the at least one ferromagnetic surface is curved in at least one dimension.

26. The magnetic field sensor of claim 25, wherein the curvature of the at least one ferromagnetic surface is selected to provide an output signal from the magnetic field sensor that is linear with respect to the relative location of the magnetic field sensor and the ferromagnetic target object along the movement axis.

27. The magnetic field sensor of claim 1, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis; and
a linearization module coupled to the differential amplifier, wherein the linearization module is operable to generate a linearized signal that is linearly related to the relative location of the magnetic field sensor and the ferromagnetic target object along the movement axis.

28. The magnetic field sensor of claim 27, further comprising:
a clamping module coupled to the linearization module and operable to generate a clamped signal corresponding to a restricted amplitude range of the linearized signal.

29. The magnetic field sensor of claim 1, further comprising:
a differential amplifier coupled to receive the first and second electronic signals and configured to generate a difference signal as a difference between the first and second electronic signals, wherein an amplitude of the difference signal is related to the relative location of the magnetic field sensor and the ferromagnetic target object along the movement axis; and
a clamping module coupled to the differential amplifier and operable to generate a clamped signal corresponding to a restricted amplitude range of the differential signal.

30. A method of sensing a relative location of a magnetic field sensor and a ferromagnetic target object along a movement axis, comprising:
generating a DC magnetic field;
placing a first magnetic field sensing elements proximate to at least one ferromagnetic surface of the ferromagnetic target object;
placing a second magnetic field sensing elements proximate to the at least one ferromagnetic surface of the ferromagnetic target object;
sensing, with the first and second magnetic field sensing elements, first and second influenced magnetic fields, respectively, related to the DC magnetic field but influenced by the at least one ferromagnetic surface; and
generating, with the first and second magnetic field sensing elements, corresponding first and second electronic signals related to the first and second influenced magnetic fields, respectively, wherein a difference of amplitudes of the first and second electronic signals is related to the relative location of the magnetic field sensor and the ferromagnetic target object along the movement axis, wherein a change of the relative location is indicative of a relative displacement of the magnetic field sensor and the ferromagnetic object, and wherein the difference of the amplitudes of the first and second electronic signals is not related to a rotation of the ferromagnetic target object about a rotation axis passing through the ferromagnetic target object.

31. The method of claim 30, wherein the at least one ferromagnetic surface consists of only first and second ferromagnetic surfaces upon the ferromagnetic target object, and wherein the first and second electronic signals are responsive only to the first and second ferromagnetic surfaces, respectively.

32. The method of claim 31, wherein the first and second ferromagnetic surfaces have first and second slopes relative to the movement axis, wherein the first slope and the second slope have opposite signs and equal angles relative to the movement axis.

33. The method of claim 31, wherein the first and second ferromagnetic surfaces have first and second slopes relative to the movement axis, wherein the first slope and the second slope have opposite signs and unequal angles relative to the movement axis.

34. The method of claim 31, wherein the first and second ferromagnetic surfaces have first and second slopes relative to the movement axis, wherein the first slope and the second slope have equal signs and unequal angles relative to the movement axis.

35. The method of claim 31, wherein the ferromagnetic target object is operable to spin about an rotation axis parallel to the movement axis, wherein the first and second electronic signals are not substantially influenced by the spin.

36. The method of claim 31, further comprising:
generating a difference signal as a difference between the first and second electronic signals, wherein an amplitude of the difference signal is related to the relative location of the magnetic field sensor and the ferromagnetic target object along the movement axis.

37. The method of claim 31, wherein the first and second ferromagnetic surfaces form a groove or a ridge.

38. The method of claim 37, wherein the first and second ferromagnetic surfaces are flat.

39. The method of claim 37, wherein at least one of the first ferromagnetic surface or the second ferromagnetic surface is curved in at least one dimension.

40. The method of claim 37, wherein the first and second ferromagnetic surfaces intersect at a vertex, and wherein a dimension of the first ferromagnetic surface perpendicular to the vertex is different than a dimension of the second ferromagnetic surface perpendicular to the vertex.

41. The method of claim 31, wherein the first and second ferromagnetic surfaces are proximate surfaces, wherein a straight tangent line is tangent to both of the first and second ferromagnetic surfaces.

42. The method of claim 41, wherein the first and second ferromagnetic surfaces are flat.

43. The method of claim 41, wherein at least one of the first ferromagnetic surface or the second ferromagnetic surface is curved.

44. The method of claim 41, wherein a dimension of the first ferromagnetic surface in a direction perpendicular to the tangent line is different than a dimension of the second ferromagnetic surface in the direction perpendicular to the tangent line.

45. The method of claim 31, wherein curvatures of the first and second ferromagnetic surfaces are selected to provide an output signal from the magnetic field sensor that is linear with respect to the relative location of the magnetic field sensor and the ferromagnetic target object along the movement axis.

46. The method of claim 31, further comprising:
generating a difference signal as a difference between the first and second electronic signals, wherein an amplitude of the difference signal is related to the relative location of the magnetic field sensor and the ferromagnetic target object along the movement axis; and
generating a linearized signal that is linearly related to a relative location of the magnetic field sensor and the ferromagnetic target object along the movement axis.

47. The method of claim 46, further comprising:
generating a clamped signal corresponding to a restricted amplitude range of the linearized signal.

48. The method of claim 31, further comprising:
generating a difference signal as a difference between the first and second electronic signals, wherein an amplitude of the difference signal is related to the relative location of the magnetic field sensor and the ferromagnetic target object along the movement axis; and
generating a clamped signal corresponding to a restricted amplitude range of the differential signal.

49. The method of claim 31, wherein the difference of the amplitudes of the first and second electronic signals is linear with respect to the relative location along the movement axis.

50. The method of claim 31 further comprising:
generating a linearized signal indicative of a linearization of the difference of the amplitudes of the first and second electronic signals with respect to the relative location along the movement axis.

51. The method of claim 30, wherein the ferromagnetic target object is operable to spin about an rotation axis parallel to the movement axis, wherein the first and second electronic signals are not substantially influenced by the spin.

52. The method of claim 30, further comprising:
generating a difference signal as a difference between the first and second electronic signals, wherein an amplitude of the difference signal is related to the relative location of the magnetic field sensor and the ferromagnetic target object along the movement axis.

53. The method of claim 30, wherein the at least one ferromagnetic surface is flat.

54. The method of claim 30, wherein the at least one ferromagnetic surface is curved in at least one dimension.

55. The method of claim 54, wherein the curvature of the at least one ferromagnetic surface is selected to provide an output signal from the magnetic field sensor that is linear with respect to the relative location of the magnetic field sensor and the ferromagnetic target object along the movement axis.

56. The method of claim 30, further comprising:
generating a difference signal as a difference between the first and second electronic signals, wherein an amplitude of the difference signal is related to the relative location of the magnetic field sensor and the ferromagnetic target object along the movement axis; and
generating, using the difference signal, a linearized signal that is linearly related to the relative location of the magnetic field sensor and the ferromagnetic target object along the movement axis.

57. The method of claim 56, further comprising:
generating, using the linearized signal, a clamped signal corresponding to a restricted amplitude range of the linearized signal.

58. The method of claim 30, further comprising:
generating a difference signal as a difference between the first and second electronic signals, wherein an amplitude of the difference signal is related to the relative location of the magnetic field sensor and the ferromagnetic target object along the movement axis; and
generating, using the difference signal, a clamped signal corresponding to a restricted amplitude range of the differential signal.

* * * * *

UNITED STATES PATENT AND TRADEMARK OFFICE
CERTIFICATE OF CORRECTION

PATENT NO. : 9,664,497 B2
APPLICATION NO. : 14/570357
DATED : May 30, 2017
INVENTOR(S) : Thomas Kerdraon et al.

It is certified that error appears in the above-identified patent and that said Letters Patent is hereby corrected as shown below:

Column 2, Line 56 delete "placing a first" and replace with --placing first--.

Column 3, Line 63 delete "an isotropic" and replace with --an anisotropic--.

Column 4, Line 27 delete "curl-era-carrying" and replace with --current-carrying--.

Column 4, Line 49 delete "be an analog" and replace with --be analog--.

Column 4, Line 65 delete "circuit" and replace with --circuits--.

Column 5, Line 27 delete "sham" and replace with --sharp--.

Column 7, Line 45 delete "element" and replace with --elements--.

Column 8, Line 12 delete "(not show)" and replace with --(not shown)--.

Column 9, Line 20 delete "vertex 710e." and replace with --vertex 710c.--.

Column 9, Line 46 delete "Ha 7" and replace with --FIG. 7--.

Column 11, Line 11 delete "form" and replace with --from--.

Column 11, Line 21 delete "signal" and replace with --signals--.

Column 13, Lines 41 to 42 delete "can be can be" and replace with --can be--.

Column 13, Line 47 delete "proximate the" and replace with --proximate to the--.

Column 15, Line 33 delete "104*a*, 104*b*" and replace with --1404*a*, 1404*b*--.

Signed and Sealed this
Eighth Day of January, 2019

Andrei Iancu
*Director of the United States Patent and Trademark Office*

CERTIFICATE OF CORRECTION (continued)
U.S. Pat. No. 9,664,497 B2

Column 15, Line 55 delete "degrees in may" and replace with --degrees may--.

Column 15, Line 64 delete "provide to or" and replace with --provide two or--.

Column 15, Line 64 delete "that a" and replace with --that are--.

Column 16, Line 3 delete "The above describe" and replace with --The above-described--.

Column 16, Line 51 delete "that that" and replace with --that the--.

Column 18, Line 60 delete "an" and replace with --a--.

Column 19, Line 54 delete "elements" and replace with --element--.

Column 19, Line 57 delete "elements" and replace with --element--.

Column 20, Line 35 delete "an" and replace with --a--.

Column 21, Line 40 delete "an" and replace with --a--.